(12) United States Patent
Groothuis et al.

(10) Patent No.: US 7,183,485 B2
(45) Date of Patent: Feb. 27, 2007

(54) MICROELECTRONIC COMPONENT ASSEMBLIES HAVING LEAD FRAMES ADAPTED TO REDUCE PACKAGE BOW

(75) Inventors: Steven K. Groothuis, Rowlett, TX (US); Steven R. Smith, Boise, ID (US); Steve Baughman, Meridian, ID (US); Bernard Ball, Kuna, ID (US); T. Michael O'Connor, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 10/386,757

(22) Filed: Mar. 11, 2003

(65) Prior Publication Data

US 2004/0177984 A1 Sep. 16, 2004

(51) Int. Cl.
*H05K 5/06* (2006.01)

(52) U.S. Cl. .................. 174/52.2; 174/521; 174/536; 257/676; 257/669

(58) Field of Classification Search ............... 174/521, 174/52.4, 52.2; 257/666, 667, 669, 670, 257/674, 676; 438/123, 124
See application file for complete search history.

(56) References Cited

U.S. PATENT DOCUMENTS

| | | | |
|---|---|---|---|
| 3,519,890 A | 7/1970 | Ashby | |
| 4,048,438 A | 9/1977 | Zimmerman | |
| 4,390,598 A | 6/1983 | Phy | |
| 4,400,714 A | 8/1983 | Brown | |
| 4,477,827 A | 10/1984 | Walker et al. | |
| 4,496,965 A | 1/1985 | Orcutt et al. | |
| 4,721,993 A | 1/1988 | Walter | |
| 4,868,635 A | 9/1989 | Frechette et al. | |
| 4,870,474 A | 9/1989 | Karashima | |
| 5,021,865 A | 6/1991 | Takahashi et al. | |
| 5,053,852 A | 10/1991 | Biswas et al. | |
| 5,094,982 A * | 3/1992 | Suzuki et al. .................. | 29/827 |
| 5,126,820 A | 6/1992 | Brown | |
| 5,145,099 A | 9/1992 | Wood et al. | |
| 5,150,193 A | 9/1992 | Yasuhara et al. | |
| 5,150,194 A | 9/1992 | Brooks et al. | |
| 5,248,075 A | 9/1993 | Young et al. | |
| 5,289,032 A | 2/1994 | Higgins, III et al. | |
| 5,309,018 A * | 5/1994 | Shibata ....................... | 257/666 |
| 5,338,972 A | 8/1994 | Negoro | |
| 5,355,018 A | 10/1994 | Fierkens | |
| 5,677,566 A | 10/1997 | King et al. | |

(Continued)

FOREIGN PATENT DOCUMENTS

WO    WO 99/65062 A2    12/1999

OTHER PUBLICATIONS

U.S. Appl. No. 10/337,438, filed Jan. 6, 2003, Johnson.

(Continued)

*Primary Examiner*—Hung V. Ngo
(74) *Attorney, Agent, or Firm*—Perkins Coie LLP

(57) ABSTRACT

The present disclosure suggests various microelectronic component assembly designs and methods for manufacturing microelectronic component assemblies. In one particular implementation, the invention provides a microelectronic component assembly that includes spaced-apart first and second lead frame members. A packaged element is disposed between the lead frame members and attached thereto only by a plurality of elongate, flexible links that permit the packaged element to accommodate thermally induced stresses by floating with respect to the first and second lead frame members.

40 Claims, 10 Drawing Sheets

U.S. PATENT DOCUMENTS

| | | | |
|---|---|---|---|
| 5,793,100 | A | 8/1998 | Takahashi |
| 5,826,628 | A | 10/1998 | Hamilton |
| 5,879,965 | A | 3/1999 | Jiang et al. |
| 5,907,902 | A | 6/1999 | Weyerman |
| 5,986,209 | A | 11/1999 | Tandy |
| RE36,469 | E | 12/1999 | Wood et al. |
| 6,048,744 | A | 4/2000 | Corisis et al. |
| 6,103,547 | A | 8/2000 | Corisis et al. |
| 6,130,474 | A | 10/2000 | Corisis |
| 6,133,068 | A | 10/2000 | Kinsman |
| 6,133,622 | A | 10/2000 | Corisis et al. |
| 6,148,509 | A | 11/2000 | Schoenfeld et al. |
| 6,150,710 | A | 11/2000 | Corisis |
| 6,153,924 | A | 11/2000 | Kinsman |
| 6,159,764 | A | 12/2000 | Kinsman et al. |
| 6,225,689 | B1 | 5/2001 | Moden et al. |
| 6,228,548 | B1 | 5/2001 | King et al. |
| 6,229,202 | B1 | 5/2001 | Corisis |
| 6,239,489 | B1 | 5/2001 | Jiang |
| 6,246,108 | B1 | 6/2001 | Corisis et al. |
| 6,246,110 | B1 | 6/2001 | Kinsman et al. |
| 6,258,623 | B1 | 7/2001 | Moden et al. |
| 6,258,624 | B1 | 7/2001 | Corisis |
| 6,261,865 | B1 | 7/2001 | Akram |
| 6,271,580 | B1 | 8/2001 | Corisis |
| 6,284,571 | B1 | 9/2001 | Corisis et al. |
| 6,291,894 | B1 | 9/2001 | Farnworth et al. |
| 6,297,547 | B1 | 10/2001 | Akram |
| 6,303,981 | B1 | 10/2001 | Moden |
| 6,303,985 | B1 | 10/2001 | Larson et al. |
| 6,310,390 | B1 | 10/2001 | Moden |
| 6,329,705 | B1 | 12/2001 | Ahmad |
| 6,331,448 | B1 | 12/2001 | Ahmad |
| 6,331,728 | B1 | 12/2001 | Chang et al. |
| 6,344,976 | B1 | 2/2002 | Schoenfeld et al. |
| 6,455,922 | B1 | 9/2002 | Arguelles et al. |
| 6,838,753 | B2 | 1/2005 | Lee et al. |
| 2002/0119598 | A1 | 8/2002 | Kawata et al. |
| 2002/0137261 | A1 | 9/2002 | Ito et al. |
| 2005/0156294 | A1 | 7/2005 | Johnson |
| 2005/0156300 | A1 | 7/2005 | Johnson |

OTHER PUBLICATIONS

Kingston Technology Company, Inc., "The Ultimate Memory Guide. Everything You Ever Wanted to Know About Memory," pp. 21-27, retrieved from the Internet on Mar. 1, 2003, <http://www.kingston.com/tools/umg/umg.pdf>.

United Test and Assembly Center Ltd., "Multi Chip Package," 1 page, retrieved from the Internet on Oct. 20, 2002, <http://www.utac.com.sg/html/products/multichip_pkg.html>.

United Test and Assembly Center Ltd., "TSOP II. Thin Small Outline Package Type II Datasheet," 2 pages, retrieved from the Internet on Oct. 20, 2002, <http://www.utac.com.sg/html/products/PDF%20datasheet/TSOP%202%20Datasheet.pdf>.

* cited by examiner

MICROELECTRONIC COMPONENT ASSEMBLIES HAVING LEAD FRAMES ADAPTED TO REDUCE PACKAGE BOW

TECHNICAL FIELD

The present invention relates to microelectronic component assemblies. In particular, aspects of the invention relate to packaged microelectronic component assemblies employing microelectronic lead frames adapted to reduce bowing of a packaged microelectronic component assembly.

BACKGROUND

Semiconductor chips or dies typically are encapsulated in a package that protects the chips from the surrounding environment. The packages typically include leads or other connection points that allow the encapsulated die to be electrically coupled to another electronic component, e.g., a printed circuit board. Typically, the leads extend laterally outwardly in a flat array that is part of a lead frame. Leaded packages include a semiconductor die, which may be attached to the lead frame either by seating the die on a die paddle or attaching the die directly to the leads, e.g., via a die attach adhesive in a leads-over-chip attachment. Some or all of the terminals of the semiconductor die then may be electrically connected to leads of the lead frame, e.g., by wire bonding. The connected lead frame and die may then be encapsulated in a mold compound to complete the packaged microelectronic component assembly. In most common applications, the leads extend outwardly from the mold compound, allowing the features of the semiconductor die to be electrically accessed. In most applications, the lead frame finally will be trimmed and formed into a desired configuration.

FIGS. 1–4 schematically illustrate one microelectronic component assembly design that has been on sale for more than one year. In the drawings, FIG. 1 is a schematic top elevation view, FIG. 2 is a schematic perspective view, and FIGS. 3 and 4 are schematic cross-sectional views taken along lines 3—3 and 4—4 of FIG. 1, respectively.

The microelectronic component assembly 10 shown in FIGS. 1–4 includes a microelectronic component 20, a mold compound 30, and a lead frame 50. The microelectronic component 20 may be any of a wide variety of known devices. In the illustrated embodiment, the microelectronic component 20 is typified as a semiconductor die having a plurality of terminals 24 arranged on an active surface 22 thereof. These terminals are arranged in a generally longitudinally disposed array to facilitate electrical connection of the terminals 24 to the leads 60 of the lead frame 50.

The lead frame 50 includes a pair of opposed end members 52a and 52b, a first set of leads 60a, and a second set of leads 60b (the first and second sets of leads being collectively referred to as leads 60). Each of the end members 52 includes a body 54 having an inner edge 56.

Each of the leads 60 includes an inner length 62 and an exposed length 64. The exposed length 64 of each lead 60 includes a tip portion 66 adjacent to its outer edge. These tip portions 66 may be connected to one another by a lead tip bar 80a or 80b, which extends between and connects the tip portions 66 of adjacent leads 60 to one another.

The inner ends of the lead inner lengths 62 may be attached to the microelectronic component 20 by a die attached adhesive 28 or the like. Selected terminals 24 of the microelectronic component 20 may be electrically coupled to selected leads 60 in any suitable fashion, e.g., using a plurality of bonding wires 26.

A first dam bar 70a may extend between and connect the exposed lengths 64 of the first set of leads 60a and a second dam bar 70b may extend between and connect the exposed lengths 64 of the second set of leads 60b. The inner edges 56 of the end members 52a, b and the dam bars 70a, b define a molding perimeter. As is known in the art, such a molding perimeter is designed to interface with a mold used to form and shape the mold compound 30, e.g., by transfer molding techniques. The mold compound 30 has a peripheral edge 32 that includes first and second longitudinal sides 34a and 34b and first and second transverse sides 34c and 34d. This peripheral edge 32 is typically spaced slightly inwardly from the molding perimeter, with the longitudinal sides 34a and 34b spaced slightly inwardly from and extending generally parallel to the adjacent dam bar 70a or 70b, respectively. The first transverse side 34c may be positioned adjacent the inner edge 56 of the first end member 52a, and the second transverse side 34d is positioned adjacent the inner edge 56 of the second end member 52b.

The microelectronic component 20, leads 60, and mold compound 30 together define a package 15. FIGS. 1–4 illustrate a single microelectronic package 15 associated with the lead frame 50. As is well known in the art, a plurality of packages 15 may be arranged in an array on a single lead frame. The lead frame 50 shown in FIGS. 1–4 is well suited for a linear array consisting of a single row of packages 15. It should be recognized, though, that lead frame members other than the end members 52 may be employed in a rectangular array with multiple rows and multiple columns of microelectronic packages 15.

FIGS. 1–4 illustrate a microelectronic component assembly 10 in which the lead frame 50 includes two sets of leads 60 extending laterally outwardly beyond opposite longitudinal sides 34a and 34b of the mold compound 30. Other microelectronic component assembly designs known in the art include leads that extend outwardly from each of the four sides of the mold compound encapsulating the microelectronic component. For example, U.S. Pat. No. 5,793,100 (the teachings of which are incorporated herein by reference) suggests several systems that employ lead frames having leads that extend outwardly from each of four rectilinear sides of a mold compound.

As is known in the art, the lead frame 50 typically is formed of a relatively thin (e.g., 0.10–0.5 mm) metal foil or the like. To improve structural integrity during manufacturing operation, the lead frame 50 of FIGS. 1–4 incorporates a plurality of relief straps 90 extending between the opposed end members 52. In particular, one of the relief straps 90 is disposed between each of the microelectronic components in an array of microelectronic components associated with the lead frame 50. In the illustrated embodiment, a first relief strap 90a extends generally parallel to the first dam bar 70a and is connected at one end to the first end member 52a and the other end to the second end member 52b. Similarly, a second relief strap 90b extends generally parallel to the second dam bar 70b and has one end connected to the first end member 52a and another end attached to the second end member 52b. Each of these relief straps 90 includes a flexible element 92 disposed approximately midway along its length. These flexible elements 92 may comprise a thin, Z-shaped length of the relief strap 90. When the relief strap 90 is subjected to stresses, as outlined below, such a flexible element 92 provides a preferred bending location for the relief strap 90, allowing it to flex more readily. In the specific design of FIGS. 1–4, the lead frame is formed of a metal foil having a thickness of about 0.127 mm (5 mils), the main body of each of the relief straps 90 has a width of about 0.90 mm, and each relief strap 90 has a width of only about 0.20 mm along the length of the flexible element 92.

The mold compound 30, lead frame 50, and the microelectronic component 20, typically have different coefficients of thermal expansion (CTEs). When the mold compound 30 is molded about the inner lengths 62 of the leads 60 and the microelectronic component 20 to cover or substantially encapsulate them, the mold compound 30 typically is introduced as a relatively hot molten plastic resin. As this resin cools, the differences in CTE between the mold compound 30, the microelectronic component 20, and the lead frame 50 places the lead frame 50 under thermally induced stress. As suggested by the dashed outline in FIG. 3, this stress can cause the packaged microelectronic component assembly 10 to bow. Although the extent of the bowing is not drawn to scale in FIG. 3, this bowing can have significant adverse consequences on the final microelectronic component assembly. The height B of the bow, i.e., the maximum deviation of the microelectronic component assembly 10 from an idealized flat configuration, can vary depending on a number of factors, including the material and dimensions of the lead frame 50, the material and dimensions of the microelectronic component 20, and the material and dimensions of the mold compound 30. In one specific implementation, a bow height B on the order of about 0.088 mm (3.45 mils) is not uncommon. When viewed in light of the 0.127 mm thickness of the lead frame, this represents a meaningful deviation of the microelectronic component assembly 10 from its idealized flat state.

DETAILED DESCRIPTION

A. Overview

Figure 1:
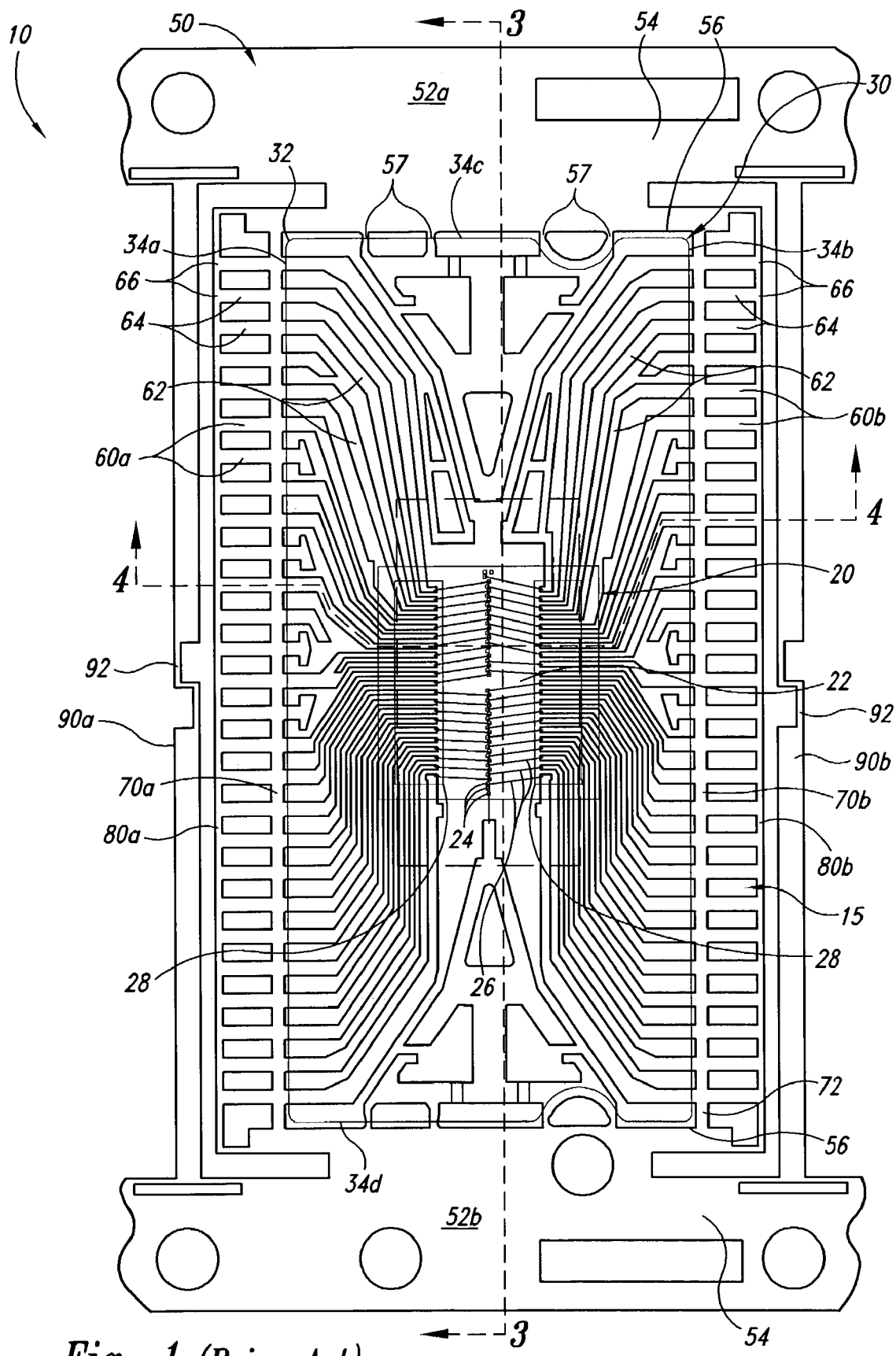
FIG. 1 is a top elevation view of a microelectronic component assembly 10 in accordance with the prior art.
Figure 2:
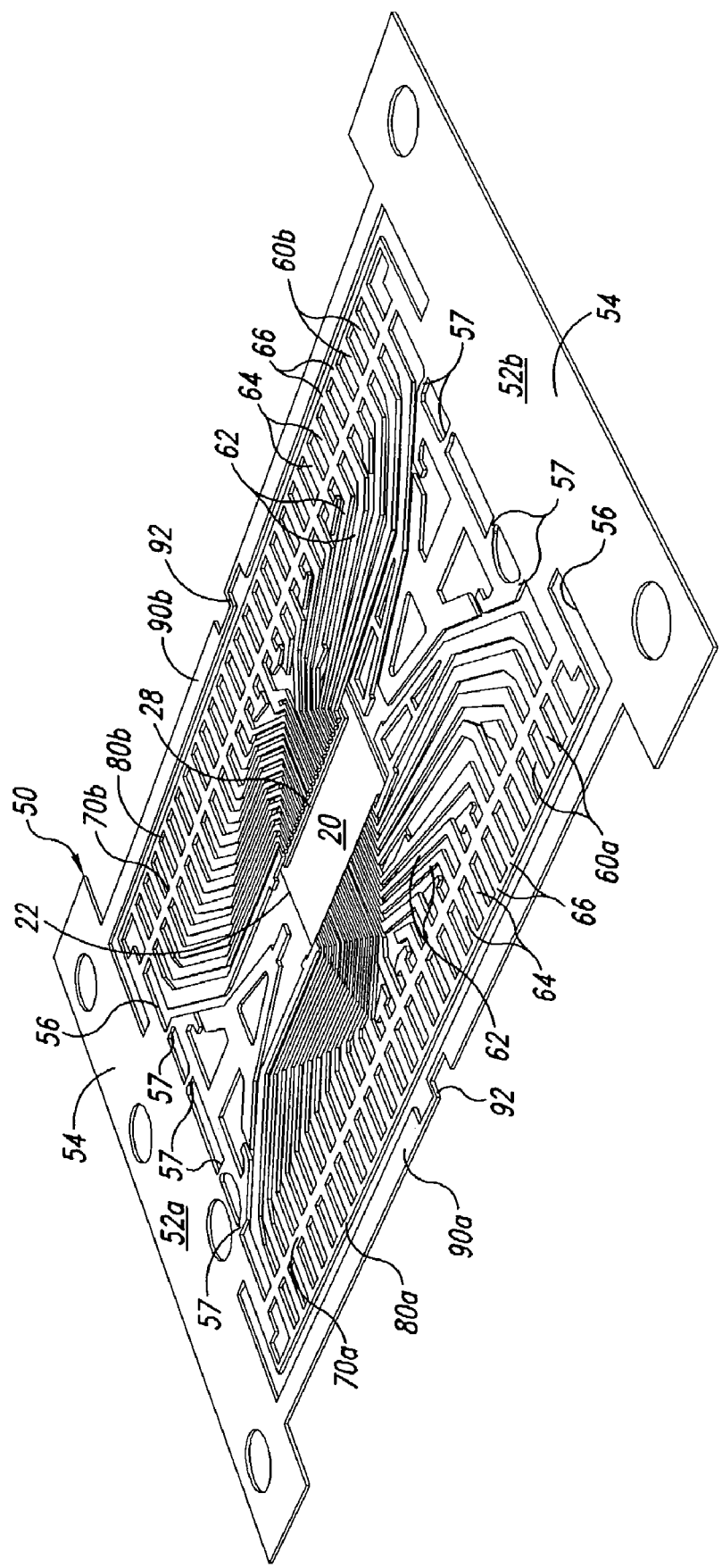
FIG. 2 is a schematic perspective view of the microelectronic component assembly 10 of FIG. 1, with selected elements removed for purposes of illustration.
Figure 3:
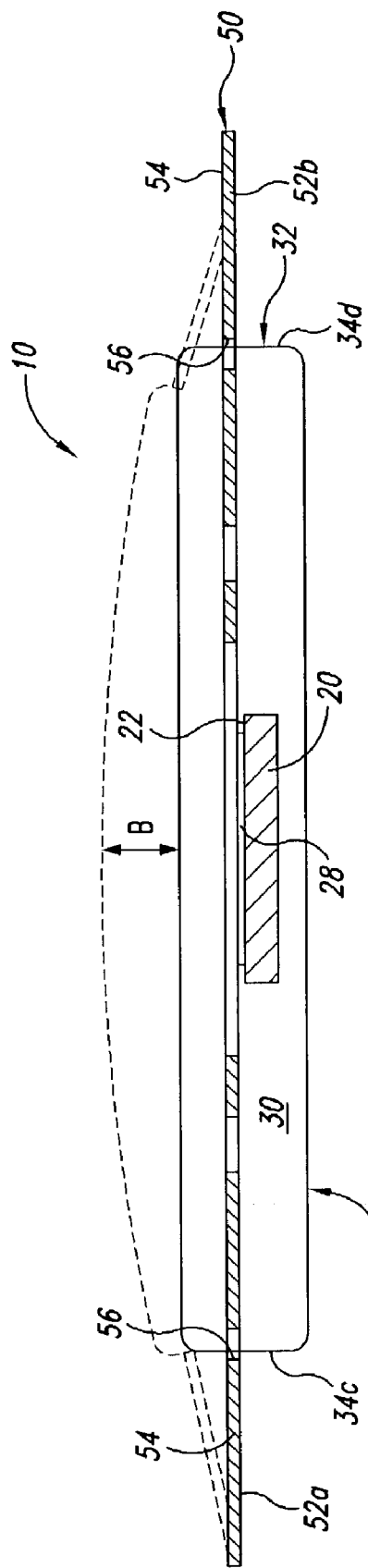
FIG. 3 is a schematic longitudinal cross-sectional view taken along line 3—3 of FIG. 1.
Figure 4:
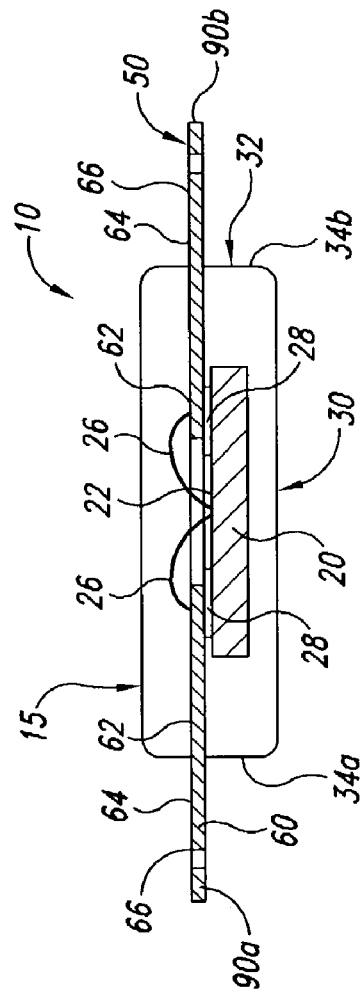
FIG. 4 is a schematic transverse cross-sectional view taken along line 4—4 of FIG. 1.

Various embodiments of the present invention provide various microelectronic component assemblies and methods for forming microelectronic component assemblies. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

A first embodiment provides a microelectronic component assembly that includes a first lead frame member, a second lead frame member, and a packaged element. The second lead frame member is spaced from the first lead frame member and the packaged element is disposed between the first and second lead frame members and attached thereto only by a plurality of elongate, flexible links that permit the packaged element to accommodate thermally induced stresses by floating with respect to the first and second lead frame members. The packaged element comprises a microelectronic component, a plurality of leads, and a mold compound. The microelectronic component carries a terminal. Each of the leads has an inner length and an exposed length, with an inner length of one of the leads being electrically coupled to the terminal of the microelectronic component. The mold compound covers the terminal and the inner lengths of each of the leads.

Another embodiment of the invention also provides a microelectronic component assembly that includes first and second lead-frame members and a packaged element. The second lead frame member is spaced from the first lead frame member. The packaged element is disposed between the first and second lead frame members and is attached thereto by a plurality of elongate, flexible connectors. In this embodiment, the packaged element is adapted to accommodate thermally induced stresses by floating substantially symmetrically with respect to the first and second lead frame members. This packaged element may be substantially the same as the packaged element in the previously-described embodiment.

A microelectronic component assembly in accordance with another embodiment includes a microelectronic component, a lead frame, and a mold compound. The lead frame includes first and second lead frame members, a set of first leads, a set of second leads, first and second dam bars, and first and second extended tie bars. Each of the lead frame members has a body and an inner edge. The set of first leads is disposed between the lead frame members, with each first lead extending laterally outwardly in a first direction from an inner length adjacent the microelectronic component to an exposed length having a tip portion spaced from the microelectronic component. The set of second leads is also disposed between the lead frame members and each second lead extends laterally outwardly in a second direction from an inner length adjacent the microelectronic component to an exposed length having a tipped portion spaced from the microelectronic component. The second direction is different from the first direction. The first dam bar extends between and connects the exposed lengths of the first leads and the second dam bar extends between and connects the exposed lengths of the second leads. The first and second dam bars and the inner edges of the first and second lead frame members together substantially define a molding perimeter. Each of the first and second extended tie bars has an exposed length and an inner length, with the exposed length coupled to the body of one of the lead frame members at a location spaced outwardly from the inner edge of the lead frame member and with at least a portion of the inner length disposed within the molding perimeter. The mold compound covers the inner lengths of the first and second leads and the inner lengths of the first and second extended tie bars. The mold compound has a peripheral edge adjacent to or spaced inwardly of the molding perimeter with the exposed length of the first and second leads and the exposed lengths of the first and second extended tie bars each extending outwardly beyond the molding perimeter.

An alternative microelectronic component assembly may include a microelectronic component, a lead frame, and a mold compound. This microelectronic component may include a plurality of terminals on an active surface. The lead frame may include opposed first and second lead frame members, a set of first leads, a set of second leads, and first and second dam bars. Each of the lead frame members has an inner edge. The set of first leads is disposed between the lead frame members, with each first lead extending laterally outwardly in a first direction from an inner length adjacent the microelectronic component to an exposed length having a tip portion spaced from the microelectronic component. The set of second leads is also disposed between the lead frame members, with each second lead extending laterally outwardly in a second direction from an inner length adjacent to the microelectronic component to an exposed length having a tip portion spaced from the microelectronic component. The second direction is different from the first direction. The first dam bar extends between and connects the exposed lengths of the first leads, with the first dam bar being connected to the first lead frame member by the elongate, flexible first dam connector and connecting to the second lead frame member by the elongate, flexible second dam connector. The first and second dam connectors allow the first dam bar to move transversely with respect to the first and second lead frame members. The second dam bar extends between and connects the exposed lengths of the second leads. The second dam bar is connected to the first lead frame member by a third dam connector and connected to the second lead frame member by a fourth dam connector. The third and fourth dam connectors allow the second dam bar to move transversely with respect to the lead frame members. The first and second dam bars and the inner edges of the first and second lead frame members together substantially define a molding perimeter. The mold compound covers the microelectronic component terminals, the inner lengths of the first leads, and the inner lengths of the second leads. The mold compound has a peripheral edge adjacent to or spaced inwardly of the molding perimeter with the exposed lengths of the first leads and the exposed lengths of the second leads each extending outwardly beyond the molding perimeter.

One further embodiment of the invention provides a method of manufacturing a microelectronic component assembly. In accordance with this method, a lead frame is juxtaposed with respect to a microelectronic component. The lead frame comprises a first lead frame member, a second lead frame member that is spaced from the first lead frame member, and a plurality of leads, each of the leads having an inner length and an outer length. The inner length of one of the leads is electrically coupled to a terminal of the microelectronic component. The terminal and the inner lengths of each of the leads are covered with a mold compound, leaving the outer length of each of the leads extending outwardly beyond a periphery of the mold compound, wherein the mold compound, the leads, and the microelectronic component define a package connected to the first and second lead frame members by a plurality of elongate, flexible lengths. The package is allowed to float with respect to the first and second lead frame members by flexing the elongate, flexible lengths in response to thermal stresses caused as the mold compound cools from a first temperature to a second temperature.

For ease of understanding, the following discussion is subdivided into two areas of emphasis. The first section discusses microelectronic lead frame designs in selected embodiments of the invention; the second section outlines methods in accordance with other embodiments of the invention.

B. Microelectronic Lead Frame Designs

Figure 5:
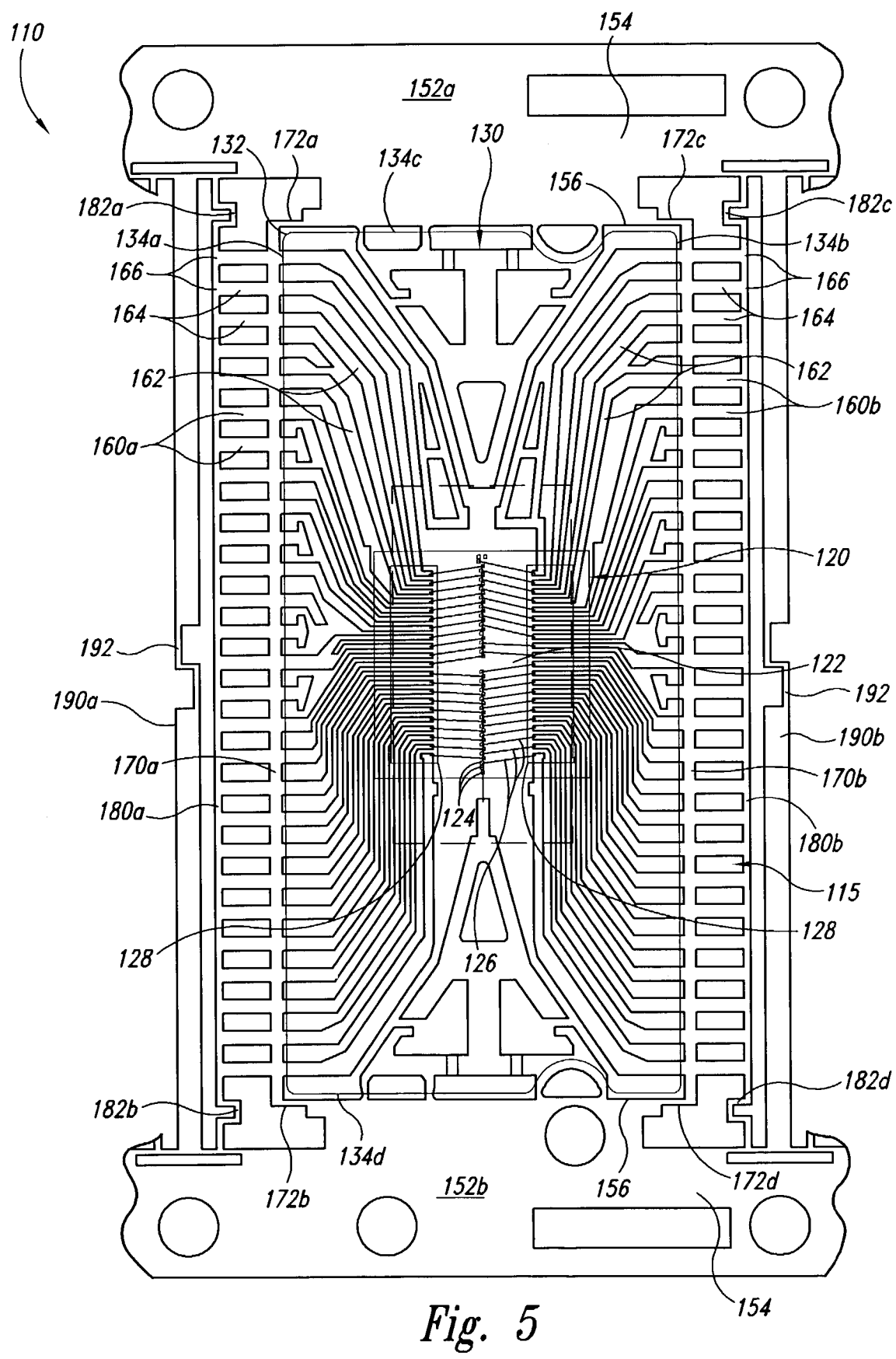
FIG. 5 is a schematic top elevation view of a microelectronic component assembly in accordance with one embodiment of the invention.

FIG. 5 schematically illustrates a microelectronic component assembly 110 in accordance with one embodiment of the invention. The microelectronic component assembly 110 of FIG. 5 may share a number of elements and structural features in common with the microelectronic component assembly 10 shown in FIGS. 1–4. Elements and structural features of the microelectronic component assembly 110 in FIG. 5 similar to analogous elements or features in FIGS. 1–4 bear like reference numbers, but incremented by 100. For example, the microelectronic component 120 of FIG. 5 may be similar to the microelectronic component 20 in FIGS. 1–4.

One of the distinctions between the microelectronic component assembly 110 of FIG. 5 and the microelectronic component assembly 10 of FIGS. 1–4 is the manner in which the dam bars 170 and the lead tip bars 180 are attached to the end members 152. In FIGS. 1–4, each of the dam bars 70 is directly connected at each of its ends 72 to one of the end members 52. There is a relatively short distance between the exposed length 64 of the lead 60 nearest the end member 52 and the inner edge 56 of the end member 52. In one particular example, the dam bar 70 has a width of about 0.35 mm, and the length of the dam bar between the inner edge 56 of an end member 52 and the exposed length 64 of the next adjacent lead 60 is about 0.63 mm. In such an embodiment, the connection between each of the dam bars 70 and the end members 52 is somewhat rigid. This can constrain movement of the mold compound 30 with respect to the end members 52. This, in turn, can concentrate thermally induced stresses in the mold compound 30 adjacent the end members 52, increasing the chances of cracking, deforming, or otherwise adversely affecting the mold compound 30 or leads 60 in those areas.

In the design of FIG. 5, the dam bars 170 are linked to the end members 152 by elongate, flexible dam connectors 172. More specifically, the first dam bar 170a may be connected to the first end member 152a by a first dam connector 172a and connected to the second end member 152b by a second dam connector 172b. Similarly, the second dam bar 170b may be connected to the first end member 152a by a first dam connector 172c and connected to the second end member 152b by a second dam connector 172d. The dam connectors 172 may take any suitable shape. In one embodiment, the connectors 172 are adapted to form a portion of the molding perimeter to facilitate transfer molding, for example. In the illustrated embodiment, each of the dam connectors 172 is generally L-shaped, with a longitudinal length in line with the rest of the dam bar 170 and a thin transverse length merging into the inner edge 156 of one of the end members 152. In one particular embodiment, the longitudinal portion of the dam connector 172 may have approximately the same width (e.g., about 0.35 mm) as the rest of the dam bar 170, whereas the transverse length is thinner. For example, the transverse length may be about 0.15 mm wide and have a length of about 0.9 mm.

The dam connectors 172 permit the dam bar 170 to which they are joined to move laterally with respect to the adjacent end members 152. Providing a relatively thin, flexible transverse length can further enhance the ability of the dam bar, and the other structures to which it is attached, to move laterally with respect to the end members 152. This helps the microelectronic component assembly 110 accommodate thermally induced stresses of the type noted above better than the microelectronic component assembly 10 of FIGS. 1–4. If so desired, the dimensions of each of the dam connectors 172 may be approximately the same, enhancing the ability of the mold compound 30 and the components received therein to float more symmetrically with respect to the end members 152, further limiting stress concentrations.

The lead tip bars 180 of the microelectronic component assembly 110 are connected to the end members 152 by elongate flexible straps 182. In the illustrated embodiment, the first lead tip bar 180a is connected to the first end member 152a by a first flexible strap 182a and to the second end member 152b by a second flexible strap 182b. The second lead tip bar 180b is joined to the first end member 152a by a first flexible strap 182c and is connected to the second end member 152b by a second flexible strap 182d. The flexible straps 182 are desirably adapted to allow the lead tip bar to move laterally with respect to the end members 152. In the illustrated embodiment, the straps 182 include a generally C-shaped intermediate length that can resiliently accommodate lateral movement of the lead tip bar 180 with respect to each of the end members 152.

Figure 6:
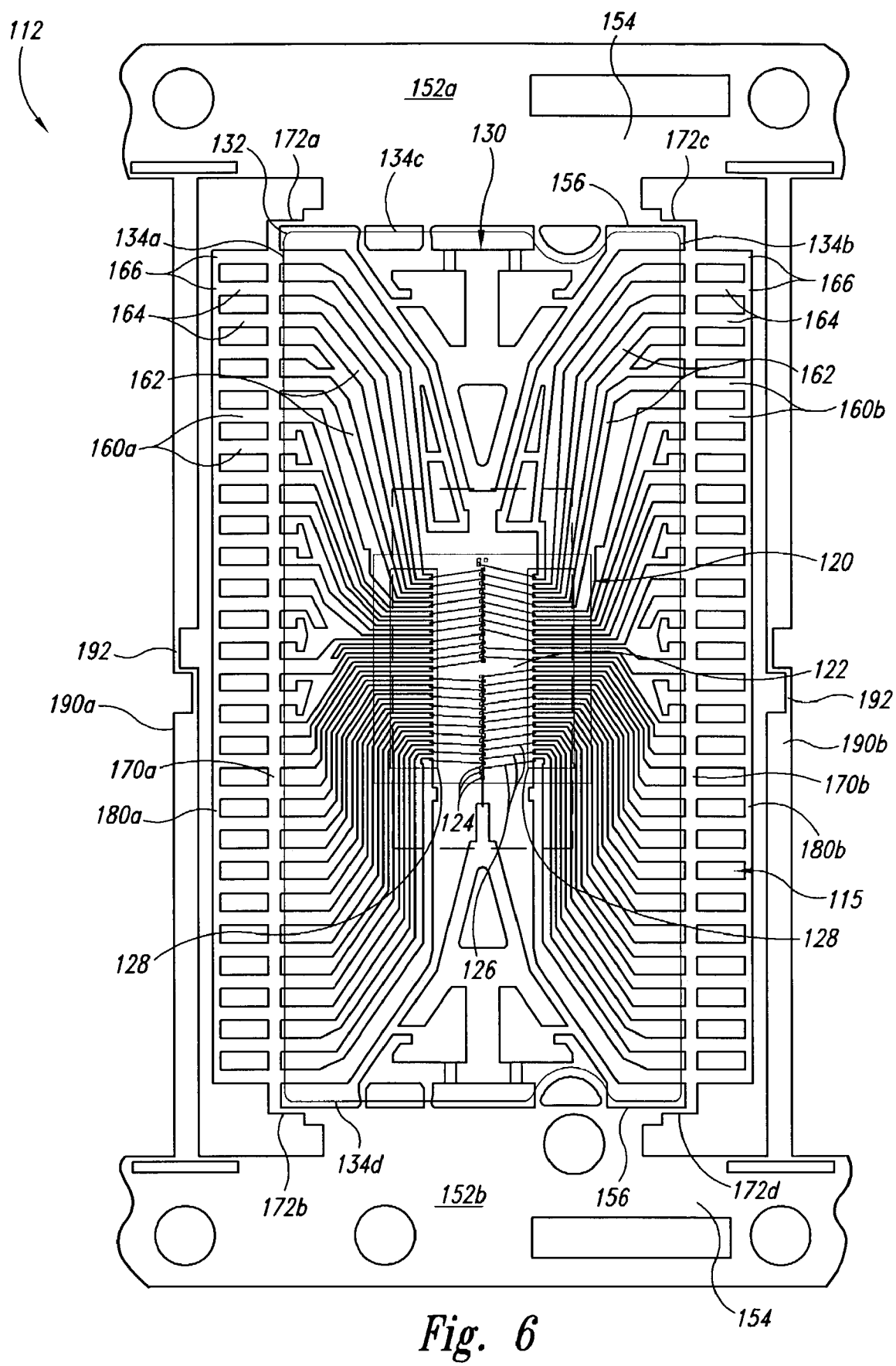
FIG. 6 is a schematic top elevation view of a microelectronic component assembly in accordance with another embodiment of the invention.

The microelectronic component assembly 112 of FIG. 6 is a different implementation of some of the principles embodied in the microelectronic component assembly 110 of FIG. 5; like reference numbers are used in FIGS. 5 and 6 to indicate like elements. The primary distinction between the microelectronic component assemblies 110 and 112 is the connection of the lead tip bars 180 to the end members 152. In FIG. 5, the lead tip bars 180 are joined to the end members 152 by elongate flexible straps 182. In FIG. 6, however, there is no such strap. Instead, the lead tip bars 180 have free ends that are proximate, but spaced from, and only indirectly connected to the end members 152. In FIG. 6, the lead tip bars 180 are connected to the tip portions 166 of the leads 160, and the leads 160 provide an indirect link between the lead tip bars 180 and the end members 152. This permits the lead tip bars 180 in FIG. 6 to move more freely with respect to the end members 152. This may further enhance the ability of the microelectronic component 120, the mold compound 130, and the leads 160 (which together define a package 115) to move or "float" with respect to the end members 152 in response to thermally induced stresses as the mold compound 30 cools.

Figure 7:
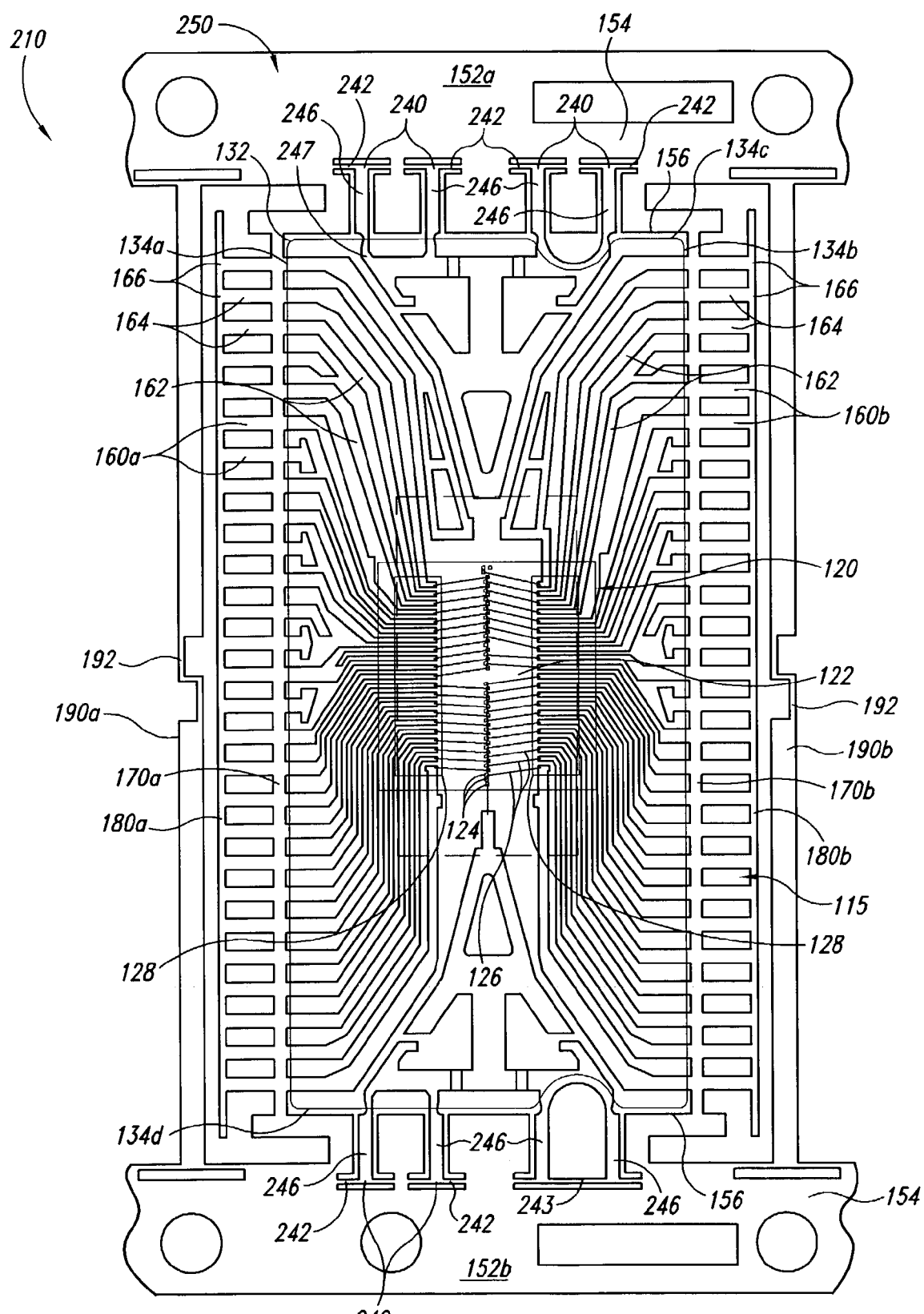
FIG. 7 is a schematic top elevation view of a microelectronic component assembly in accordance with still another embodiment of the invention.

FIG. 7 is a top elevation view of a microelectronic component assembly 210 in accordance with an alternative embodiment. Many of the elements of the microelectronic component assembly 210 of FIG. 7 may be substantially the same as components of the microelectronic component assembly 110 of FIG. 5. Like reference numbers are used in FIGS. 5 and 7 to refer to like elements.

The connection between the dam bars 170 and the end members 152 in FIG. 7 may be analogous to the connection between the dam bars 70 and the end members 52 of FIGS. 1–4. Similarly, the connection between the lead tip bars 180 and the end members 152 in FIG. 7 may be substantially the same as the connection between the lead tip bars 80 and end members 52 in FIGS. 1–4, though this connection is severed in the specific embodiment shown in FIG. 7. One of the distinctions between the microelectronic component assemblies 10 and 210 relates to the manner in which the body of the package (15 in FIGS. 1, 3 and 4; 115 in FIG. 7) is connected to the end members (52 in FIGS. 1–4; 152 in FIG. 7). In the design of FIGS. 1–4, there is a very short distance between the transverse sides 34c and 34d of the mold compound peripheral edge 32 and the adjacent end members 52a and 52b, respectively. In FIGS. 1–4, each end member 52 is provided with four tie bars 57 that have inner lengths imbedded in the mold compound 30 and help stabilize the body of the package 15 with respect to the end members 52. Due to the close proximity of the mold compound 30 to the inner edges 56 of the end members 52, the exposed length of these tie bars 57 is quite short. Consequently, these tie bars 57 hamper movement of the package 15 with respect to the adjacent end members 52.

The microelectronic component assembly 210 of FIG. 7 provides a much more flexible connection between the package 115 and the end members 152 of the lead frame 250. The body of the package 115 in FIG. 7 is attached to the end members 152 by a plurality of extended tie bars 246. These extended tie bars 246 each include an inner length 247 that is covered by the mold compound 130 and an outer length extending outwardly beyond the transverse side 134c or 134d of the mold compound peripheral edge 132. This exposed outer length of each extended tie bar is connected to the body 154 of an end member 152 at a flexible junction 240. This junction 240 is spaced outwardly from the inner edge 156 of the respective end member 152.

If so desired, the junction 240 may comprise a direct connection of an end of the extended tie bar 246 to the body 154 of the end member 152. In the illustrated embodiment, each of the junctions 240 comprises a pivot bar 242 or 243 attached to an end of the extended tie bar 246. If so desired, some or all of the extended tie bar 246 may be separately attached to the body 154 of the respective end member 152 by a dedicated pivot bar 242. Alternatively, two or more of the extended tie bars 246 may be coupled to a common elongate pivot bar 243.

In one embodiment, the extended tie bars 246 are relatively narrow, e.g., on the order of about 0.3–0.4 mm. This, in combination with a relatively narrow gap on either side of each of the extended tie bars 246, helps provide an end member inner edge 156 that can help substantially define a molding perimeter for the mold compound 130, as discussed above. In the illustrated embodiment, the exposed length of each extended tie bar 246 has an aspect ratio of greater than one, i.e., it is longer than it is wide. In one exemplary embodiment, the exposed length of the extended tie bar is about five times the width of the extended tie bar 246. This is in stark contrast to the rather short tie bars 57 employed in the prior art microelectronic component assembly 10 of FIGS. 1–4.

These extended tie bars 246 allow the package 115 to move both laterally and "vertically" (i.e., into or out of the plane of the page in FIG. 7) with respect to the end members 152. It has been found that freeing the package 15 from the relatively tight constraints imposed by the short tie bars 57 employed in the prior art microelectronic component assembly 10 substantially reduces the bow height (B in FIG. 3) of the microelectronic component assembly when it cools. This, in turn, avoids some of the stress concentration in the leads 160 and mold compound 130 seen in the design of FIGS. 1–4.

Figure 8:
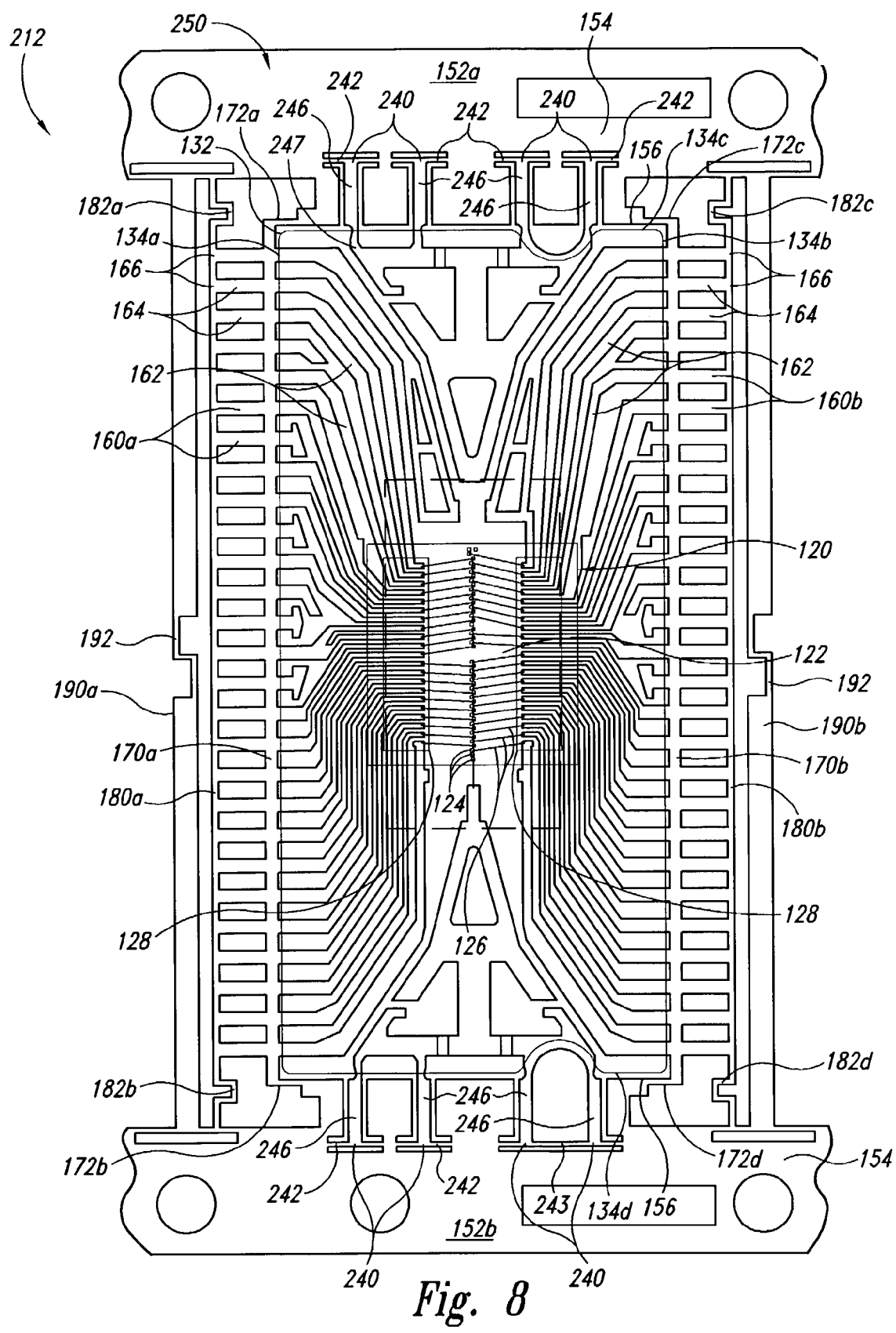
FIG. 8 is a schematic top elevation view of a microelectronic component assembly in accordance with an alternative embodiment of the invention.

FIG. 8 schematically illustrates a microelectronic component assembly 212 in accordance with another embodiment. This microelectronic component assembly 212 is similar in many respects to the microelectronic component assembly 210 of FIG. 7, and like reference numbers are used in both Figures to designate like elements. The connection between the dam bars 170 and lead tip bars 180 in FIG. 7 are similar to those employed in the design shown in FIGS. 1–4. The microelectronic component assembly of FIG. 8, however, employs connections more similar to those employed in the microelectronic component assembly 110 of FIG. 5. In particular, each of the dam bars 170 is connected to the end members 152a–b by a pair of longitudinally flexible dam connectors 172. In addition, each of the lead tip bars 180 may be connected to each of the end members 152 by a flexible strap 182. As discussed above in connection with the design of FIG. 5, these flexible dam connectors 172 can facilitate lateral movement of the dam bars 170 with respect to the end members 152, and the flexible straps 182 may improve the mobility of the lead tip bars 180 with respect to the end members 152.

Hence, the package 115 in the microelectronic component assembly 212 of FIG. 8 is connected to the end members 152 only by a plurality of elongate, flexible links, namely, the extended tie bar 246, flexible dam connectors 172, and flexible straps 182. Connecting a package 115 to the end members 152 in this fashion allows the package 115 to float with respect to the end members 152 to accommodate thermally induced stresses. This can materially reduce the package bow height B without unduly compromising the mechanical integrity of the lead frame 250 necessary to reliably manufacture the microelectronic component assemblies 212 using automated equipment.

Figure 9:
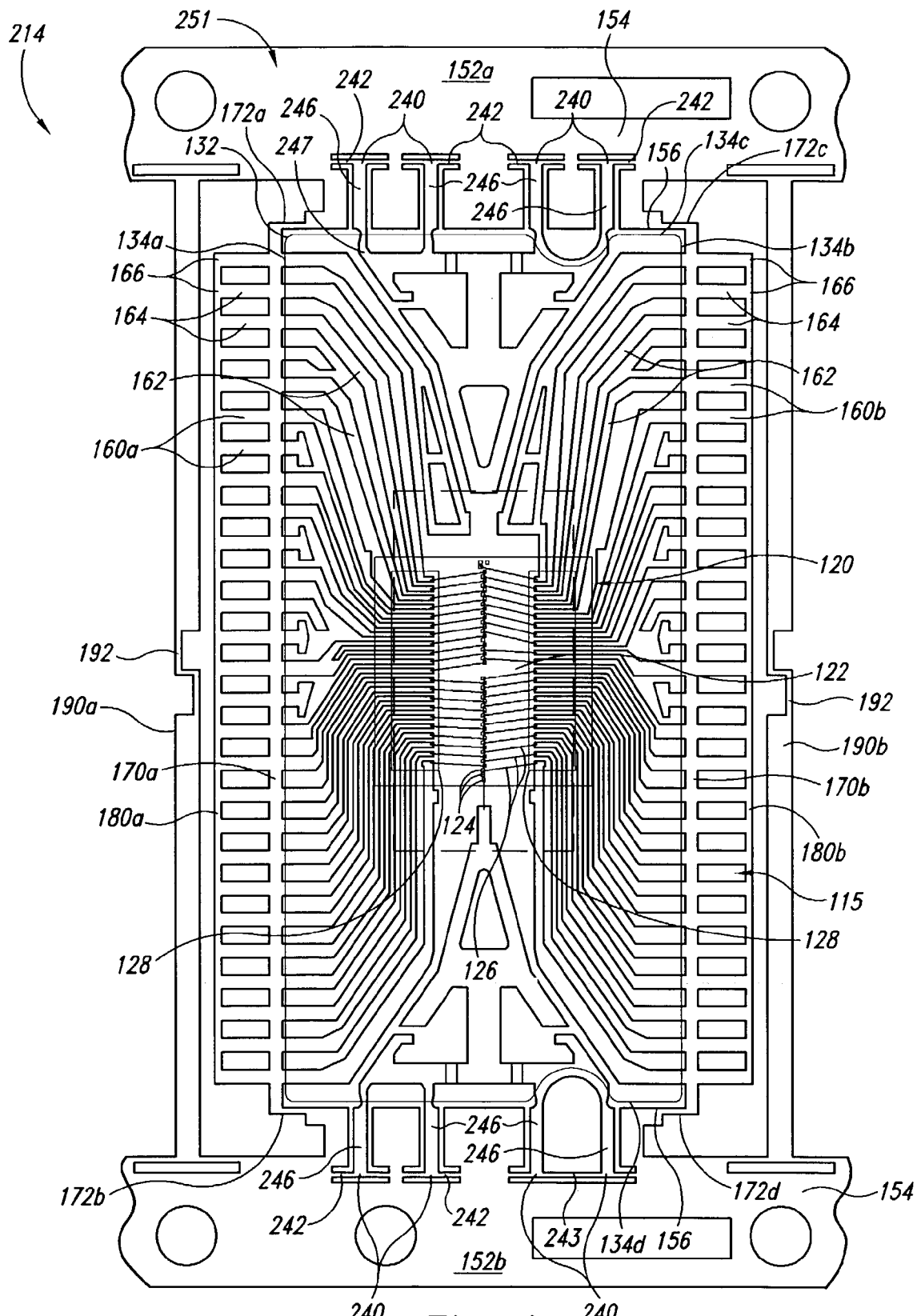
FIG. 9 is a schematic top elevation view of a microelectronic component assembly in accordance with yet another embodiment of the invention.

FIG. 9 illustrates a microelectronic component assembly 214 in accordance with another embodiment. This microelectronic component assembly 214 is similar to the microelectronic component assembly 212 shown in FIG. 8, and like reference numbers are used in both Figures to refer to like elements. The primary difference between the microelectronic component assemblies 212 and 214 lies in the connection of the lead tip bars 180 to the end members 152. In FIG. 8, the lead tip bars 180 are coupled to the end members 152 by a flexible strap 182. In the embodiment of FIG. 9, though, each lead tip bar 180 has two ends, one of which is proximate, but spaced from, and only indirectly connected to the first end member 152a and the other of which is proximate, but spaced from, and only indirectly connected to the second end member 152b. As noted above in connection with FIG. 6, having the lead tip bars 180 only indirectly connected to the end members 152 enhances the ability of the package 115 to move without undue hindrance with respect to the end members 152. By having the dam bars 170 connected to the end members 152 by the flexible dam connectors 172, a relatively continuous molding perimeter may be maintained for purposes of transfer molding operations or the like.

Another embodiment of the invention not specifically illustrated in the drawings has a structure similar to that shown in FIG. 1. In this alternative design, however, the relief straps 90 and the flexible elements 92 are substantially thinner than those employed in the manufactured embodiment illustrated in FIGS. 1–4. As noted above, each of the relief straps 90 in the design of FIG. 1 has a thickness of about 0.127 mm (5 mils), a main body with a width of about 0.90 mm, and a flexible element 92 having a width of about 0.20 mm. In a thin relief strap alternative (referred to below as the "TRS assembly"), the main body of each of the relief straps 90 instead has a width of about 0.5–0.7 mm (e.g., about 0.60 mm) and the flexible elements 92 have a width of less than about 0.2 mm (e.g., about 0.14 mm).

C. Experimental Analysis

Computer modeling was conducted to evaluate anticipated performance of various microelectronic component assembly designs. In each analysis, the material and thickness of the lead frame, the microelectronic component and its connection to the lead frame, the thickness and material of the mold compound, and the temperature change encountered during cooling after the initial molding operation remained the same.

Figure 10:
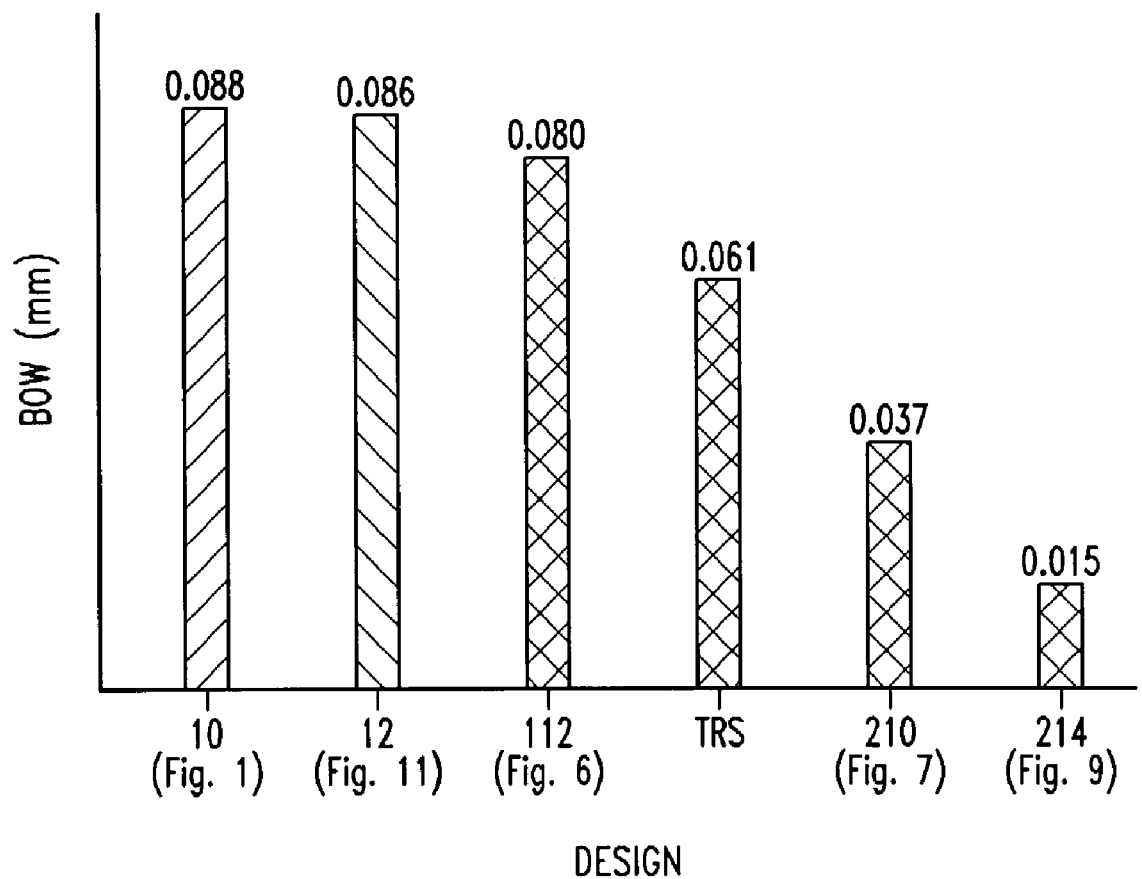
FIG. 10 is a bar graph schematically illustrating the reduction in package bow achieved with selected embodiments of the invention.

FIG. 10 graphically illustrates the bow height (B in FIG. 3) calculated for each of several designs. The first bar on this bar graph generally corresponds to the prior art microelectronic component assembly 10 of FIG. 1. The second bar generally corresponds to a modified microelectronic component assembly 12, shown in FIG. 11, that is similar to the microelectronic component assembly 10, but in which ends of the lead tip bars 80 have been severed so there is no direct connection between the lead tip bars 80 and the end members 52. The third bar in FIG. 10 generally corresponds to the microelectronic component assembly 112 shown in FIG. 6. The fourth bar generally corresponds to the TRS assembly discussed above, which employs thin relief straps 90 between the end members 52. The fifth bar generally corresponds to the microelectronic component assembly 210 shown in FIG. 7. Finally, the last bar in FIG. 10 generally corresponds to the microelectronic component assembly 214 shown in FIG. 9. The exact design employed in calculating the results depicted in FIG. 10 may differ in some respects from the designs illustrated in FIG. 1–9 or 11. Nonetheless, the bar graph of FIG. 10 is believed to provide a representative indication of at least qualitative differences between the designs.

Figure 11:
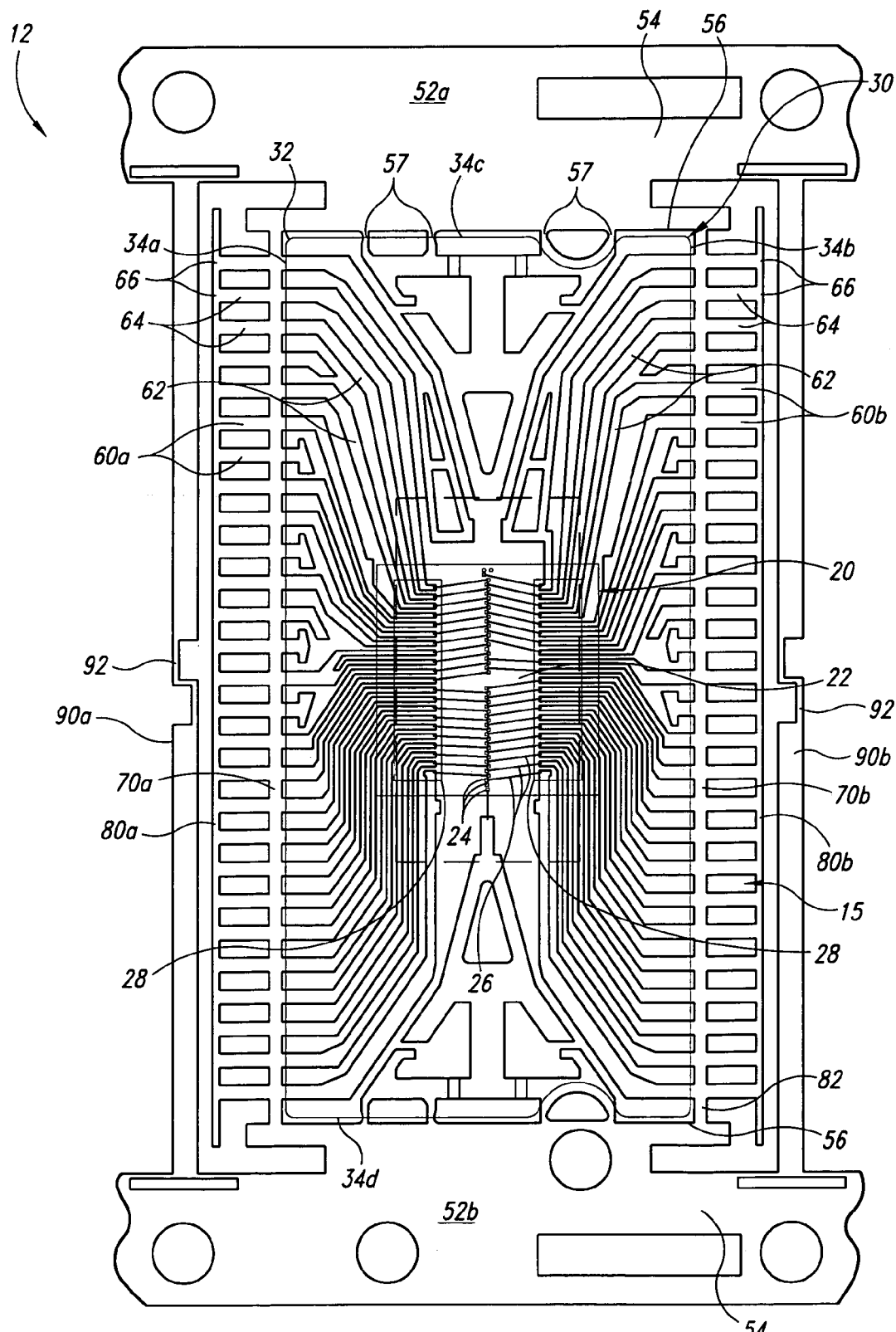
FIG. 11 is a schematic top elevation view of a microelectronic component assembly provided for purposes of illustration.

As seen in FIG. 10, severing the connection between the ends of the lead tip bars 80 and the end members 52 as illustrated in FIG. 11 has a relatively nominal effect on the anticipated package bow height B, reducing the anticipated bow height from about 0.088 mm (3.5 mils) to about 0.086 mm (3.40 mils), or a little under 1.5%. In contrast, the microelectronic component assembly 112 of FIG. 6 is expected to have a package bow on the order of about 0.080 mm (3.15 mils), a reduction of almost 9% compared to the microelectronic component assembly 10 of FIGS. 1–4. The TRS assembly discussed above (employing thin relief straps 90) is anticipated to reduce the bow height B by about 30% to about 0.061 mm (2.41 mils).

The two most remarkable reductions in anticipated bow height B among the designs shown in FIG. 10 were achieved by the microelectronic component assemblies 210 (FIG. 7) and 214 (FIG. 9). The microelectronic component 210 has an anticipated package bow of only about 0.037 mm (1.45 mils), representing a 58% reduction in bow height B. It is believed that the use of the extended tie bars arms 246 in the lead frame 250 allows the package 115 to float relatively freely and symmetrically with respect to the end members 152, contributing substantially to this marketed reduction in package bow. The microelectronic component assembly 214 of FIG. 9 has an anticipated package bow of only about 0.015 mm (0.6 mils), a rather significant 83% reduction from the package bow height calculated for the prior art design schematically illustrated in FIG. 1. Like the microelectronic component assembly 210 of FIG. 7, this microelectronic component assembly 214 employs extended tie bars 246 to connect the body of the package 115 to the end members 152. In the design of FIG. 7, the dam bars 170 are connected to the inner edges 156 of the end members 152 by a relatively short length of the dam bar 170. In the microelectronic component assembly 214 of FIG. 9, however, the dam bars 170 are connected to the end members 152 by flexible dam connectors 172. As a consequence, the package 115 in FIG. 9 is connected to the end members 152 only by a plurality of elongate, flexible lengths. This permits the package 115 to float even more freely with respect to the end members 152 to accommodate thermally induced stresses, as evidenced by the greater than 80% reduction in anticipated bow height B.

D. Methods

As noted above, other embodiments of the invention provide methods of assembling microelectronic component assemblies. In the following discussion, reference is made to the particular microelectronic component assembly shown in FIG. 9. It should be understood, though, that reference to this particular microelectronic component assembly is solely for purposes of illustration and that the method outlined below is not limited to any particular microelectronic component assembly design shown in the drawings or discussed in detail above. By way of example, the particular embodiments illustrated in the drawings each employ lead frames that have leads extending transversely outwardly from only two sides of the mold compound. Aspects of the method outlined below may be employed in manufacturing microelectronic component assemblies in which leads extend outwardly from four or more edges of the mold compound.

The microelectronic component assembly 214 of FIG. 9 can be manufactured in a variety of ways. In accordance with one embodiment, the microelectronic component assembly 214 is assembled by first juxtaposing the lead frame 251 with respect to the microelectronic component 120. The relative positions of the lead frame 251 and the microelectronic component 120 are dictated in large part by their respective geometries and the manner in which they are to be electrically connected. In the embodiment shown in FIG. 9, the microelectronic component 120 may be positioned adjacent the inner lengths 162 of the leads 160, with the terminals 124 of the microelectronic component disposed between the first set of leads 160a and the second set of leads 160b. If so desired, the microelectronic component 120 may be attached to the leads 160 by means of a die attached adhesive 128. FIGS. 5–9 illustrate only a single package 115 between the end members 152. As noted above, though, a plurality of packages 115 may be arranged in a linear array, a rectangular array, or any other suitable arrangement. If an array of packages is to be produced, the lead frame 251 may be juxtaposed with respect to a plurality of microelectronic components 120 at one time.

The inner length 162 of at least one of the leads 160 may be electrically coupled to at least one of the terminals 124 of the microelectronic component 120. In the illustrated embodiment, this is accomplished by means of one or more bonding wires 126. As will be recognized by those skilled in the art, other arrangements may employ ball grid array junctions or other suitable connections between the leads 160 and the microelectronic component 120.

The lead frame 251 and the microelectronic component(s) 120 may be positioned with respect to a molding element at the outset of a molding operation. The nature of the molding element and its relationship to the lead frame 251 and microelectronic components 120 will vary depending on the molding technique employed. If transfer molding is employed, for example, the lead frame 251 will be positioned between first and second mold elements (not shown) that define a mold cavity within which the microelectronic component 120 is received. The mold elements may engage the molding perimeter of the lead frame 251, defined by the dam bars 170 (including the flexible dam connectors 172) and the inner edge 156 of each of the end members 152. A molding compound may then be introduced in the mold cavity. As is known in the art, this is conventionally accomplished by injecting a flowable plastic resin into the mold cavity to cover the lead inner lengths 162, the bonding wires 126, and at least the active surface 122 (including the terminals 124) of the microelectronic component 120. The mold cavity will define a peripheral edge 132 of the mold compound 130, leaving the exposed lengths 164 of the leads 160 extending laterally outwardly from opposite longitudinal sides 134a and 134b of the mold compound 130. As noted above, this will effectively define a package 115 that includes the microelectronic component 120, the leads 160, and the mold compound 130.

The mold compound may then be cooled from the initial molding temperature to a lower temperature, such as room temperature. This can be accomplished by actively cooling the mold compound or allowing it to passively radiate its heat to the ambient environment. As the mold compound 130 cools, the differences in CTE of the mold compound 130, the microelectronic component 20 and the lead frame 251 can induce stresses on the package 115. As noted above, the package 115 in FIG. 9 is connected to the end members 152 only by a plurality of elongate, flexible links, namely, the dam connectors 172 and the extended tie bars 246. The package 115 is allowed to float with respect to the end members 152 by flexure of these elongate, flexible links. As described above in connection with FIG. 10, embodiments of the invention can materially reduce the package bow, which may be seen as an indicator of the thermally induced stresses on the package 115.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above-detailed descriptions of embodiments of the invention are not intended to be exhaustive or to limit the invention to the precise form disclosed above. For example, the microelectronic component assemblies 110, 112, 210, 212, 214, and 12 discussed above each employ lead frames having leads extending only from two opposite sides of the mold compound. In other embodiments, leads may extend out of all four sides of the mold compound. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A microelectronic component assembly comprising:
   a first lead frame member;
   a second lead frame member, the second lead frame member being spaced from the first lead frame member; and
   a packaged element disposed between the first and second lead frame members and attached to the first and second lead frame members only by a plurality of elongate, flexible links that permit the packaged element to accommodate thermally induced stresses by floating with respect to the first and second lead frame members, the packaged element comprising:
      a microelectronic component carrying a terminal;
      a plurality of leads having an inner length and an exposed length, the inner length of one of the leads being electrically coupled to the terminal of the microelectronic component;
      a mold compound covering the terminal and the inner lengths of the individual leads; and
      a dam bar extending between and interconnecting the exposed lengths of the leads, the dam bar being attached to the first lead frame member by a flexible first dam connector and attached to the second lead frame member by a flexible second dam connector, at least one of the first and second dam connectors including a flexible transverse length and permitting the dam bar to move laterally with respect to the first and second lead frame members.

2. The microelectronic component assembly of claim 1 further comprising a lead tip bar extending between and connecting tip portions of the exposed lengths of the leads, the lead tip bar having first and second ends, the first end of the lead tip bar being proximate, but spaced from, and only indirectly connected to the first lead frame member and the second end of the lead tip bar being proximate, but spaced from, and only indirectly connected to the second lead frame member.

3. The microelectronic component assembly of claim 1 wherein the plurality of leads includes a first set of leads that extend laterally outwardly of a periphery of the mold compound in a first direction and a second set of leads that extend laterally outwardly of the periphery of the mold compound in a different second direction.

4. The microelectronic component assembly of claim 1 wherein at least one of the first and second dam connectors has a generally L-shape, with a longitudinal length in line with the dam bar and the flexible transverse length merging into one of the first and second lead frame members.

5. The microelectronic component assembly of claim 1 wherein the plurality of leads includes a first set of leads that extend laterally outwardly of a periphery of the mold compound in a first direction and a second set of leads that extend laterally outwardly of the periphery of the mold compound in a different second direction, further comprising a first dam bar extending between and interconnecting the exposed lengths of the first set of leads and a second dam bar extending between and interconnecting the exposed lengths of the second set of leads.

6. The microelectronic component assembly of claim 5 wherein the first and second dam bars, an inner edge of the first lead frame member, and an inner edge of the second lead frame member together substantially define a molding perimeter.

7. The microelectronic component assembly of claim 1 further comprising a relief strap extending between and interconnecting the first and second lead frame members, the relief strap being spaced from the leads.

8. The microelectronic component assembly of claim 1 further comprising a relief strap extending between and interconnecting the first and second lead frame members, the relief strap being spaced from the leads and including a stress relief member intermediate the first and second lead frame members.

9. The microelectronic component assembly of claim 1 wherein one of the elongate flexible links comprises a first dam connector and a second one of the elongate flexible links comprises a second dam connector, further comprising a dam bar extending between and connecting the exposed lengths of the leads, the dam bar being connected to the first lead frame member by the first dam connector and connected to the second lead frame member by the second dam connector.

10. The microelectronic component assembly of claim 1 wherein one of the elongate flexible links comprises a first extended tie bar having an inner length covered by the mold compound and an outer length extending outwardly beyond the mold compound to a junction with the first lead frame member, the junction being spaced outwardly beyond an inner edge of the first lead frame member.

11. The microelectronic component assembly of claim 1 wherein one of the elongate flexible links comprises a first extended tie bar and a second one of the elongate flexible links comprises a second extended tie bar; the first extended tie bar having an inner length covered by the mold compound and an outer length extending outwardly beyond the mold compound to a first junction with the first lead frame member, the first junction being spaced outwardly beyond an inner edge of the first lead frame member; and the second extended tie bar having an inner length covered by the mold compound and an outer length extending outwardly beyond the mold compound to a second junction with the second lead frame member, the second junction being spaced outwardly beyond an inner edge of the second lead frame member.

12. The microelectronic component assembly of claim 1 wherein the packaged element is a first packaged element, further comprising a second packaged element disposed between the first and second lead frame members and attached to the first and second members by a second plurality of elongate flexible connectors, the second packaged element comprising:
   a second microelectronic component carrying a second terminal;
   a plurality of second leads, each of which has an inner length and an exposed length, the inner length of one of the second leads being electrically coupled to the second terminal; and
   a second mold compound covering the second terminal and the inner lengths of each of the second leads, the second mold compound being spaced from the mold compound of the first packaged element.

13. The microelectronic component assembly of claim 12 further comprising a relief strap extending between and interconnecting the first and second lead frame members, the relief strap being disposed between the first and second packaged elements.

14. A microelectronic component assembly comprising:
a first lead frame member;
a second lead frame member, the second lead frame member being spaced from the first lead frame member; and
a packaged element disposed between the first and second lead frame members and attached to the first and second lead frame members by a plurality of elongate flexible connectors, the packaged element being adapted to accommodate thermally induced stresses by floating substantially symmetrically with respect to the first and second lead frame members, the packaged element comprising:
a microelectronic component carrying a terminal;
a plurality of leads having an inner length and an exposed length, the inner length of one of the leads being electrically coupled to the terminal of the microelectronic component;
a mold compound covering the terminal and the inner lengths of the individual leads; and
a dam bar extending between and interconnecting the exposed lengths of the leads, the dam bar being attached to the first lead frame member by a flexible first dam connector and attached to the second lead frame member by a flexible second dam connector, at least one of the first and second dam connectors including a flexible transverse length and permitting the dam bar to move laterally with respect to the first and second lead frame members.

15. The microelectronic component assembly of claim 14 further comprising a lead tip bar extending between and connecting tip portions of the exposed lengths of the leads, the lead tip bar having first and second ends, the first end of the lead tip bar being proximate, but spaced from, and only indirectly connected to the first lead frame member and the second end of the lead tip bar being proximate, but spaced from, and only indirectly connected to the second lead frame member.

16. The microelectronic component assembly of claim 14 wherein the plurality of leads includes a first set of leads that extend laterally outwardly of a periphery of the mold compound in a first direction and a second set of leads that extend laterally outwardly of the periphery of the mold compound in a different second direction.

17. The microelectronic component assembly of claim 14 wherein at least one of the first and second dam connectors has a generally L-shape, with a longitudinal length in line with the dam bar and the flexible transverse length merging into one of the first and second lead frame members.

18. The microelectronic component assembly of claim 14 wherein the plurality of leads includes a first set of leads that extend laterally outwardly of a periphery of the mold compound in a first direction and a second set of leads that extend laterally outwardly of the periphery of the mold compound in a different second direction, further comprising a first dam bar extending between and interconnecting the exposed lengths of the first set of leads and a second dam bar extending between and interconnecting the exposed lengths of the second set of leads.

19. The microelectronic component assembly of claim 18 wherein the first and second dam bars, an inner edge of the first lead frame member, and an inner edge of the second lead frame member together substantially define a molding perimeter.

20. The microelectronic component assembly of claim 14 further comprising a relief strap extending between and interconnecting the first and second lead frame members, the relief strap being spaced from the leads.

21. The microelectronic component assembly of claim 13 further comprising a relief strap extending between and interconnecting the first and second lead frame members, the relief strap being spaced from the leads and including a stress relief member intermediate the first and second lead frame members.

22. The microelectronic component assembly of claim 14 wherein one of the elongate flexible connectors comprises a first dam connector and a second one of the elongate flexible connectors comprises a second dam connector, further comprising a dam bar extending between and connecting the exposed lengths of the leads, the dam bar being connected to the first lead frame member by the first dam connector and connected to the second lead frame member by the second dam connector.

23. The microelectronic component assembly of claim 14 wherein one of the elongate flexible connectors comprises a first extended tie bar having an inner length covered by the mold compound and an outer length extending outwardly beyond the mold compound to a junction with the first lead frame member, the junction being spaced outwardly beyond an inner edge of the first lead frame member.

24. The microelectronic component assembly of claim 14 wherein one of the elongate flexible connectors comprises a first extended tie bar and a second one of the elongate flexible connectors comprises a second extended tie bar; the first extended tie bar having an inner length covered by the mold compound and an outer length extending outwardly beyond the mold compound to a first junction with the first lead frame member, the first junction being spaced outwardly beyond an inner edge of the first lead frame member; and the second extended tie bar having an inner length covered by the mold compound and an outer length extending outwardly beyond the mold compound to a second junction with the second lead frame member, the second junction being spaced outwardly beyond an inner edge of the second lead frame member.

25. The microelectronic component assembly of claim 14 wherein the packaged element is a first packaged element, further comprising a second packaged element disposed between the first and second lead frame members and attached to the first and second members by a second plurality of elongate flexible connectors, the second packaged element comprising:
a second microelectronic component carrying a second terminal;
a plurality of second leads, each of which has an inner length and an exposed length, the inner length of one of the second leads being electrically coupled to the second terminal; and
a second mold compound covering the second terminal and the inner lengths of each of the second leads, the second mold compound being spaced from the mold compound of the first packaged element.

26. The microelectronic component assembly of claim 25 further comprising a relief strap extending between and interconnecting the first and second lead frame members, the relief strap being disposed between the first and second packaged elements.

27. A microelectronic component assembly comprising:
a microelectronic component;
a lead frame including:
first and second lead frame members, each lead frame member having a body and an inner edge;

a set of first leads disposed between the lead frame members, each first lead extending laterally outward in a first direction from an inner length adjacent the microelectronic component to an exposed length having a tip portion spaced from the microelectronic component;

a set of second leads disposed between the lead frame members, each second lead extending laterally outward in a second direction from an inner length adjacent the microelectronic component to an exposed length having a tip portion spaced from the microelectronic component, the second direction being different from the first direction;

a first dam bar extending between and connecting the exposed lengths of the first leads, the first dam bar being connected to the first lead frame member by an elongate, flexible first dam connector and connected to the second lead frame member by an elongate, flexible second dam connector, at least one of the first and second dam connectors including a flexible transverse length and allowing the first dam bar to move transversely with respect to the first and second lead frame members;

a second dam bar extending between and connecting the exposed lengths of the second leads, the first and second dam bars and the inner edges of the first and second lead frame members together substantially defining a molding perimeter;

a first extended tie bar having an exposed length and an inner length, the exposed length being coupled to the body of the first lead frame member at a location spaced outwardly from the inner edge of the first lead frame member, and at least a portion of the inner length being disposed within the molding perimeter; and a second extended tie bar having an exposed length and an inner length, the exposed length being coupled to the body of the second lead frame member at a location spaced outwardly from the inner edge of the second lead frame member, and at least a portion of the inner length being disposed within the molding perimeter; and a mold compound covering the inner lengths of the first leads, the inner lengths of the second leads, the inner length of the first extended tie bar, and the inner length of the second extended tie bar, the mold compound having a peripheral edge adjacent to or spaced inwardly of the molding perimeter with the exposed lengths of the first leads, the exposed lengths of the second leads, the exposed length of the first extended tie bar, and the exposed length of the second extended tie bar each extending outwardly beyond the molding perimeter.

28. The microelectronic component assembly of claim 27 further comprising a first lead tip bar extending between and connecting tip portions of the exposed lengths of the first leads, the first lead tip bar having first and second ends, the first end of the first lead tip bar being proximate, but spaced from, and only indirectly connected to the first lead frame member and the second end of the first lead tip bar being proximate, but spaced from, and only indirectly connected to the second lead frame member.

29. The microelectronic component assembly of claim 27 further comprising a relief strap extending between and interconnecting the first and second lead frame members, the relief strap being spaced from the first leads and from the second leads.

30. The microelectronic component assembly of claim 27 further comprising a relief strap extending between and interconnecting the first and second lead frame members, the relief strap being spaced from the first leads and the second leads and the relief strap including a stress relief member intermediate the first and second lead frame members.

31. The microelectronic component assembly of claim 27 wherein the mold compound is a first mold compound, further comprising:

a second microelectronic component;

a set of third leads, each of which has an inner length adjacent the microelectronic component and an exposed length spaced from the microelectronic component;

a set of fourth leads, each of which has an inner length adjacent the microelectronic component and an exposed length spaced from the microelectronic component; and a second mold compound covering the inner lengths of each of the third leads and the inner lengths of the fourth leads, the second mold compound being spaced from the first mold compound.

32. The microelectronic component assembly of claim 31 further comprising a relief strap extending between and interconnecting the first and second lead frame members, the relief strap being disposed between the set of second leads and the set of third leads.

33. The microelectronic component assembly of claim 27 wherein at least one of the first and second dam connectors has a generally L-shape, with a longitudinal length in line with the dam bar and the flexible transverse length merging into one of the first and second lead frame members.

34. A microelectronic component assembly comprising:

a microelectronic component having a plurality of terminals on an active surface;

a lead frame including:

opposed first and second lead frame members, each lead frame member having an inner edge;

a set of first leads disposed between the lead frame members, each first lead extending laterally outward in a first direction from an inner length adjacent the microelectronic component to an exposed length having a tip portion spaced from the microelectronic component;

a set of second leads disposed between the lead frame members, each second lead extending laterally outward in a second direction from an inner length adjacent the microelectronic component to an exposed length having a tip portion spaced from the microelectronic component, the second direction being different from the first direction;

a first dam bar extending between and connecting the exposed lengths of the first leads, the first dam bar being connected to the first lead frame member by an elongate, flexible first dam connector and connected to the second lead frame member by an elongate, flexible second dam connector, at least one of the first and second dam connectors including a first flexible transverse length and allowing the first dam bar to move transversely with respect to the first and second lead frame members; and a second dam bar, extending between and connecting the exposed lengths of the second leads, the second dam bar being connected to the first lead frame member by an elongate, flexible third dam connector and connected to the second lead frame member by an elongate, flexible fourth dam connector, at least one of the third and fourth dam connectors including a second flexible transverse length and allowing the second dam bar to move transversely with respect to the first and second lead frame members, the first and second dam bars and the inner edges of the first and second lead frame members together substantially defining a molding perimeter; and a mold compound covering the microelectronic component terminals, the inner lengths of the first leads, and the inner lengths of the second leads, the mold compound having a peripheral edge adjacent to or spaced inwardly of the molding perimeter with the exposed lengths of the first leads and the exposed lengths of the second leads each extending outwardly beyond the molding perimeter.

35. The microelectronic component assembly of claim 33 further comprising a relief strap extending between and interconnecting the first and second lead frame members, the relief strap being spaced from the first leads and from the second leads.

36. The microelectronic component assembly of claim 33 further comprising a relief strap extending between and interconnecting the first and second lead frame members, the relief strap being spaced from the first leads and the second leads and the relief strap including a stress relief member intermediate the first and second lead frame members.

37. The microelectronic component assembly of claim 33 wherein the mold compound is a first mold compound, further comprising:

a second microelectronic component;
a set of third leads, each of which has an inner length adjacent the microelectronic component and an exposed length spaced from the microelectronic component;
a set of fourth leads, each of which has an inner length adjacent the microelectronic component and an exposed length spaced from the microelectronic component; and
a second mold compound covering the inner lengths of each of the third leads and the inner lengths of the fourth leads, the second mold compound being spaced from the first mold compound.

38. The microelectronic component assembly of claim 37 further comprising a relief strap extending between and interconnecting the first and second lead frame members, the relief strap being disposed between the set of second leads and the set of third leads.

39. The microelectronic component assembly of claim 34 further comprising a first lead tip bar extending between and connecting tip portions of the exposed lengths of the first leads, the first lead tip bar having first and second ends, the first end of the first lead tip bar being proximate, but spaced from, and only indirectly connected to the first lead frame member and the second end of the first lead tip bar being proximate, but spaced from, and only indirectly connected to the second lead frame member.

40. The microelectronic component assembly of claim 34 wherein at least one of the first, second, third, and fourth dam connectors has a generally L-shape, with a longitudinal length in line with the dam bar and the flexible transverse length merging into one of the first and second lead frame members.

* * * * *